US009791783B2

United States Patent
Hur et al.

(10) Patent No.: US 9,791,783 B2
(45) Date of Patent: Oct. 17, 2017

(54) EXPOSURE APPARATUS AND EXPOSURE METHOD USING THE SAME

(71) Applicant: Samsung Display Co., Ltd., Yongin (KR)

(72) Inventors: Jae-Weon Hur, Busan (KR); Hong-Yeon Lee, Seoul (KR); Baek-Kyun Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 90 days.

(21) Appl. No.: 14/453,040

(22) Filed: Aug. 6, 2014

(65) Prior Publication Data

US 2015/0227056 A1    Aug. 13, 2015

(30) Foreign Application Priority Data

Feb. 13, 2014   (KR) .................. 10-2014-0016550

(51) Int. Cl.
G03B 27/58 (2006.01)
G03F 7/20 (2006.01)
G02F 1/13 (2006.01)
G02F 1/1337 (2006.01)

(52) U.S. Cl.
CPC ........ *G03F 7/70191* (2013.01); *G02F 1/1303* (2013.01); *G02F 1/133788* (2013.01)

(58) Field of Classification Search
CPC ............... G03F 7/70191; G02F 1/1303; G02F 1/133788
See application file for complete search history.

(56) References Cited

U.S. PATENT DOCUMENTS

| 5,898,480 | A | * | 4/1999 | Ozawa ................ G03F 7/70058 355/53 |
| 6,031,597 | A | * | 2/2000 | Knirck ..................... G03F 7/20 355/53 |
| 6,063,829 | A | | 5/2000 | Endou et al. |
| 7,227,126 | B2 | | 6/2007 | Nakama |
| 8,059,266 | B2 | | 11/2011 | Hult et al. |
| 8,691,481 | B2 | * | 4/2014 | Ikeda .................. G03F 7/70425 355/67 |
| 2005/0002005 | A1 | * | 1/2005 | Terada ................ G03F 7/70733 355/53 |

(Continued)

FOREIGN PATENT DOCUMENTS

CN   1578596   2/2005
CN   1841207   10/2006

(Continued)

OTHER PUBLICATIONS

Office Action dated Aug. 25, 2017, in Chinese Patent Application No. 201510062073.8.

*Primary Examiner* — Deoram Persaud
(74) *Attorney, Agent, or Firm* — H.C. Park & Associates, PLC

(57) ABSTRACT

An exposure apparatus including a substrate transporting unit configured to transport a substrate in a first direction, and including a first measuring part; and an exposure part disposed over the substrate transporting unit configured to irradiate the substrate with ultraviolet rays. The first measuring part is configured to measure an intensity of the ultraviolet rays before the substrate is irradiated.

20 Claims, 12 Drawing Sheets

(56) References Cited

U.S. PATENT DOCUMENTS

| | | | |
|---|---|---|---|
| 2006/0141373 A1* | 6/2006 | Casper Bijnen | G03F 7/70291 430/22 |
| 2006/0219947 A1* | 10/2006 | Van De Kerkhof | G03F 7/70566 250/492.1 |
| 2007/0115450 A1* | 5/2007 | Nagasaka | G03F 7/70341 355/72 |
| 2008/0049206 A1 | 2/2008 | Ossmann | |
| 2010/0002212 A1 | 1/2010 | Harayama et al. | |
| 2012/0002183 A1* | 1/2012 | Ota | G03F 7/70291 355/67 |
| 2012/0307222 A1* | 12/2012 | Van Zwet | G03F 7/704 355/67 |
| 2013/0088704 A1* | 4/2013 | Mei | G03F 7/20 355/72 |
| 2013/0323651 A1* | 12/2013 | Solak | G03F 7/201 430/322 |
| 2014/0063480 A1* | 3/2014 | Wu | G03F 7/70725 355/72 |
| 2014/0118534 A1* | 5/2014 | Lee | G01N 21/958 348/125 |
| 2014/0147577 A1* | 5/2014 | Lee | H01L 51/56 427/8 |
| 2014/0322655 A1* | 10/2014 | Nishida | H01J 37/20 430/296 |
| 2015/0109597 A1* | 4/2015 | Schmitt | G02B 5/3025 355/71 |
| 2015/0370246 A1* | 12/2015 | Yuk | H01L 21/681 700/112 |

FOREIGN PATENT DOCUMENTS

| | | |
|---|---|---|
| CN | 101454724 | 6/2009 |
| CN | 102314093 | 1/2012 |
| CN | 102822749 | 12/2012 |
| JP | 4103376 | 4/2008 |
| JP | 4504665 | 4/2010 |
| JP | 2012-211984 | 11/2012 |
| JP | 2013-054144 | 3/2013 |
| JP | 2013-178445 | 9/2013 |

* cited by examiner

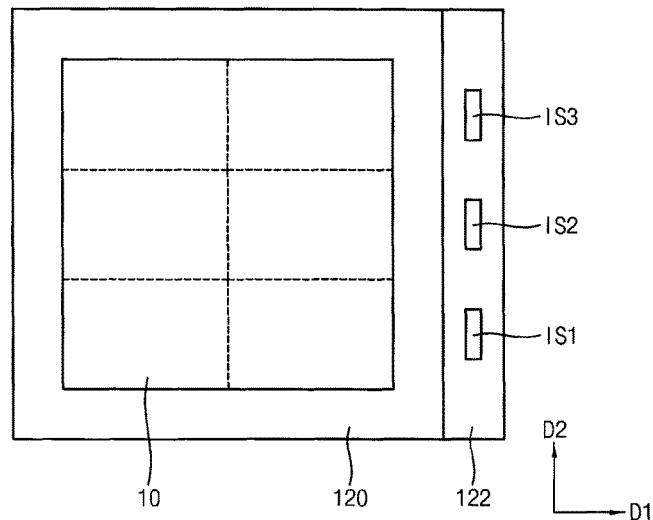
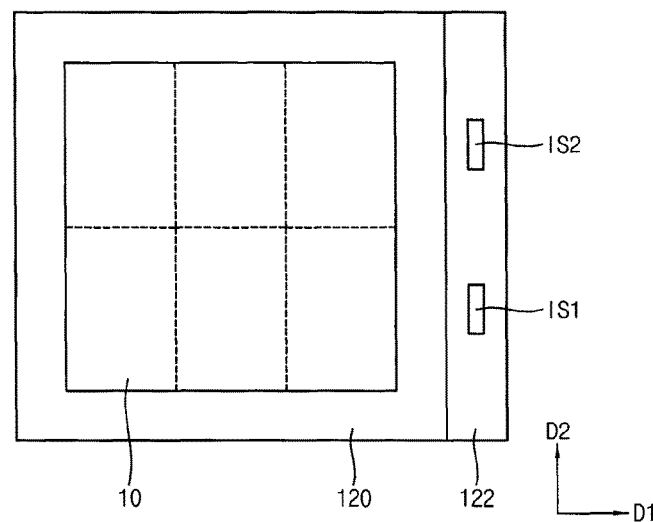

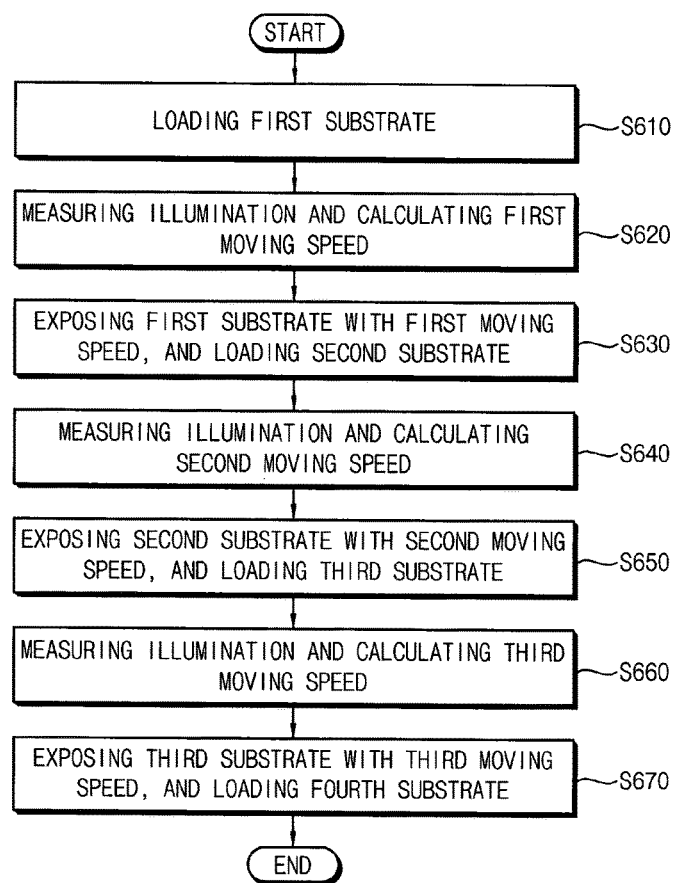

EXPOSURE APPARATUS AND EXPOSURE METHOD USING THE SAME

CROSS REFERENCE TO RELATED APPLICATION

This application claims priority from and the benefit of Korean Patent Application No. 10-2014-0016550, filed on Feb. 13, 2014, which is hereby incorporated by reference for all purposes as if fully set forth herein.

BACKGROUND

Field

Exemplary embodiments of the inventive concept relate to an exposure apparatus and an exposure method using the exposure apparatus.

More particularly, exemplary embodiments of the inventive concept relate to an exposure apparatus for forming a photo-alignment layer of a liquid crystal display apparatus.

Discussion of the Background

Recently, display apparatuses having light weight and small size have been manufactured. Cathode ray tube (CRT) display apparatuses have typically been used due to high performance and a competitive price. However CRT display apparatuses are large and lack portability. Therefore, display apparatuses such as plasma display apparatuses, liquid crystal display apparatuses, and organic light emitting display apparatuses have been highly regarded due to their small size, light weight, and low power-consumption.

The display apparatus typically includes an array substrate having a circuit wiring, an opposite substrate facing the array substrate, and a liquid crystal layer disposed between the array substrate and the opposite substrate. The display apparatus typically further includes an alignment layer to give a pre-tilt angle to liquid crystal molecules of the liquid crystal layer.

SUMMARY

An alignment layer may be formed by a photo-alignment process using an exposure apparatus. However, there have been problems regarding a lack of uniformity of ultraviolet rays formed by the exposure apparatus.

Exemplary embodiments of the inventive concept provide an exposure apparatus capable of uniformly exposing to a plurality of substrates.

Exemplary embodiments of the inventive concept also provide an exposure method using the exposure apparatus.

Additional features of the invention will be set forth in the description which follows, and in part will be apparent from the description, or may be learned by practice of the invention.

According to an exemplary embodiment of the inventive concept, an exposure apparatus includes a substrate transporting unit to transport a substrate in a first direction and including a sensor configured to measure amount of ultraviolet ray, and an exposure part disposed over the substrate transporting unit to expose the substrate to ultraviolet rays.

According to an exemplary embodiment of the inventive concept, an exposure method includes calculating and measuring (S100), wherein characteristics of ultraviolet rays generated from an exposure part is measured and speed and amount of exposure are calculated using the measured characteristics, exposing a substrate (S200), wherein a substrate is exposed by the ultraviolet with the speed and amount of exposure which is calculated in the S100, calculating and measuring (S300), wherein characteristics of ultraviolet rays generated from an exposure part is measured again and speed and amount of exposure are calculated using the newly measured characteristics, and exposing a substrate (S400), wherein a substrate is exposed by the ultraviolet with the speed and amount of exposure which is newly calculated in the S300.

In an exemplary embodiment, in the exposing a substrate (S200), a first substrate and a second substrate may be exposed in order. The calculating and measuring (S100) may include measuring illumination of ultraviolet rays and calculating a second moving speed. In the illumination of ultraviolet ray, intensity of the ultraviolet rays of ultraviolet generated from the exposure part may be measured. The intensity of the ultraviolet rays may mean a total energy amount of the ultraviolet rays irradiated on a unit area during a unit time. In other words, the intensity of the ultraviolet rays refers to the intensity (irradiance) of the ultraviolet rays impacting one of the sensors IS. In the calculating a second moving speed, a second moving speed, which is a moving speed of the second substrate, may be calculated. The second moving speed may satisfy following equations.

intensity of the ultraviolet rays*exposure time per one substrate=constant value <equation1> exposure time per one substrate=exposure distance of second substrate/moving speed of second substrate <equation2>

Thus, according to exemplary embodiments of present inventive concept, an exposure apparatus includes a sensor to measure an intensity of the ultraviolet rays and a stage to transport a plurality of substrates. Thus, the exposure apparatus provides uniform exposure to a plurality of substrates by continuously adjusting the moving speed of the substrate as a mathematic function of the intensity of the ultraviolet rays.

In addition, first to third stages include first to third measuring parts, respectively, so that proper moving speed of the stages may be applied in real-time in accordance with change of the intensity of the ultraviolet rays.

Further, according to exemplary embodiments of the present invention, the exposure method repeats the step of measuring intensity of the ultraviolet rays and calculating exposure speed. Thus, when a plurality of substrates is exposed, although ultraviolet rays may decrease due to senescence of a UV lamp of an exposure part, the substrates may be uniformly exposed by continuously adjusting the speed of exposure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

The above and other features of the inventive concept will become more apparent by describing in detail exemplary embodiments thereof with reference to the accompanying drawings.

FIG. 2 is a plan view detail illustrating a second stage of FIG. 1.

FIG. 3 is a plan view detail illustrating a second stage according to an exemplary embodiment of the inventive concept.

FIG. 13 is a flow chart illustrating an exposure method according to an exemplary embodiment of the inventive concept.

DETAILED DESCRIPTION OF THE ILLUSTRATED EMBODIMENTS

Figure 1:
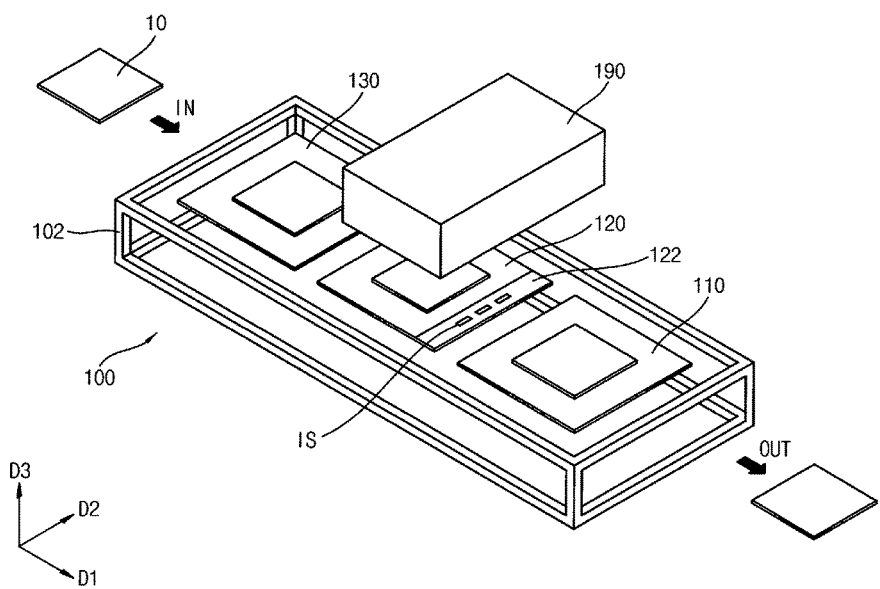
FIG. 1 is a perspective view illustrating an exposure apparatus according to an exemplary embodiment of the inventive concept.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a perspective view illustrating an exposure apparatus according to an exemplary embodiment of the inventive concept.

Referring to FIG. 1, an exposure apparatus 100 includes a frame 102, a first stage 110, a second stage 120, a third stage 130, and an exposure part 190.

The first frame 102 extends in a first direction D1, and has a width in a second direction D2 which is substantially perpendicular to the first direction D1. A plurality of stages is disposed on the frame 102. The frame 102 supports the stages. The stages may be continuously transferred on the frame in the first direction D1.

For example, the stages include the first stage 110, the second stage 120, and the third stage 130. As described in the figure, a substrate 10 is loaded on the third stage 130 (refers to an arrow IN in FIG. 1). Then, the third stage 130 may be moved in the first direction D1. Accordingly, the substrate 10 on the third stage 130 may be exposed by light while passing under the exposure part 190 to a position of the second stage 120 in FIG. 1. While the third stage 130 moves, the second stage 120 moves in the first direction D1 to a position of the first stage 110 in FIG. 1, a substrate is unloaded from the first stage 110 (refers to an arrow OUT in the FIG. 1) and the first stage 110 moves in a direction opposite to the first direction D1 to a position of the third stage 130 in FIG. 1. For example, the first stage 110 may move through the frame 102 in a direction opposite to the first direction D1, so that the first stage 110 may be disposed at a loading position to load a substrate 10. For example, the first stage 110 may move opposite to the first direction D1, sidestepping the exposure part 190, to be placed at a loading position to load a substrate. Accordingly, the first to third stages 110, 120 and 130 continuously move in the first direction D1, so that a plurality of substrates 10 may be transferred in the first direction D1.

After the substrate 10 is loaded on the first stage 110 (refers to an arrow IN in FIG. 1), the first stage 110 then transports the substrate 10 in the first direction D1. The substrate 10 then passes under the exposure part 190. Then, the substrate 10 is unloaded from the first stage 110 (refers to an arrow OUT in FIG. 1). The first stage 110 may hold the substrate 10 by a vacuum adsorption to transfer the substrate 10.

The substrate 10 is loaded on the second stage 120 (refers to an arrow IN in FIG. 1). The second stage 120 then transports the substrate 10 in the first direction D1. The substrate 10 then passes under the exposure part 190. Following that, the substrate 10 is unloaded from the second stage 120 (refers to an arrow OUT in FIG. 1). The second stage 120 may hold the substrate 10 by vacuum adsorption to transport the substrate 10.

The second stage 120 includes a measuring part 122. The measuring part 122 is disposed at a side of the second stage 120 in the first direction D1. For example, the measuring part 122 is disposed in front of the second stage 120 in the first direction D1, which is a movement direction of the substrate 10, so that the measuring part 122 may pass under the exposure part 190 before the substrate 10 on the second stage 120 is exposed by the exposure part 190.

The measuring part 122 extends in the second direction D2. The measuring part 122 may include a plurality of sensors IS. The sensors IS may measure characteristics of ultraviolet rays generated by the exposure part 190. The substrates 10 may be uniformly exposed by controlling the intensity and exposure time of the ultraviolet rays generated by the exposure part 190, using the characteristics of ultraviolet rays measured by the sensors IS.

The substrate 10 is loaded on the third stage 130 (refers to an arrow IN in FIG. 1). The second stage 120 then transports the substrate 10 in the first direction D1. The substrate 10 then passes under the exposure part 190, and then the substrate 10 is unloaded from the third stage 130 (refers to an arrow OUT in FIG. 1). The third stage 130 may hold the substrate 10 by vacuum adsorption to transport the substrate 10.

The exposure part 190 is disposed on the frame 102. The exposure part 190 is spaced apart from the frame 102 in a third direction D3, which is substantially perpendicular to the first and second directions D1 and D2. The exposure part 190 is disposed between a portion of the frame 102 where the substrate 10 is loaded (refers to an arrow IN in FIG. 1) and a portion of the frame 102 where the substrate 10 is unloaded (refers to an arrow OUT in FIG. 1).

The exposure part 190 includes a UV light source that generates ultraviolet rays, and a wire grid polarizer for polarizing the ultraviolet rays. The exposure part 190 radiates the ultraviolet rays onto the substrates 10 disposed on the first, second, and/or third stages, 110, 120, or 130. Accordingly, the ultraviolet rays from the exposure part 190 may harden a photo-alignment material coated on the substrate 10 to form a photo-alignment layer on the substrate 10.

The UV light source may be a UV lamp extending in the second direction D2. In addition, the UV light source may be a plurality of UV lamps arranged in the second direction D2, and each of the UV lamps may extend in the second direction D2. The UV lamps may be controlled to generate the ultraviolet rays having different intensities.

The exposure part 190 may be tilted with respect to a plane in parallel with the first and second directions D1 and D2. In addition, the substrate 10 may be tilted with respect to the plane in parallel with the first and second directions D1 and D2. Accordingly, alignment direction of the photo-alignment layer may be inclined by a predetermined angle with respect to a boundary of the substrate 10 and the plane, in parallel with the first and second directions D1 and D2.

FIG. 2 is a plan view illustrating a second stage of FIG. 1.

Referring to FIG. 2, a substrate 10 is laid on a second stage 120. The substrate 10 may be fixed by a substrate fixing part on the second stage 120. For example, the substrate fixing part may be a plurality of vacuum holes on the second stage 120, which generates negative pressure, the substrate 10 may be fixed on the second stage 120 by a vacuum absorption through vacuum holes. In addition, the substrate fixing part may be a holder to grab the substrate 10.

The second stage 120 includes a measuring part 122 that extends along a side of the second stage 120 in the second direction D2. Thus, the measuring part 122 is formed corresponding to a width of the substrate 10 in a second direction D2.

A photo-alignment layer is formed on the substrate 10 by coating a photo-alignment material on the substrate 10. The substrate 10 may be a substrate for manufacturing a plurality of display panels for liquid crystal display apparatuses. The display panel may include a liquid crystal layer including liquid crystal molecules. The display panel may include an alignment layer that gives a pre-tilt angle to the liquid crystal molecules. The alignment layer may be the photo-alignment layer hardened by radiation from the ultraviolet rays.

After an exposure process, the substrate 10 may be separated into a plurality of substrates. For example, the substrate 10 may be divided into three parts in the second direction D2 (refers to dotted line in FIG. 2). The substrate may be further divided in the direction D1.

The measuring part 122 includes a plurality of sensors IS. The sensors IS may measure characteristics of ultraviolet rays generated by the exposure part (refers to 190 of FIG. 1). The sensors IS include a first sensor IS1, a second sensor IS2, and a third sensor IS3. The first sensor IS1, the second sensor IS2, and the third sensor IS3 are disposed in the second direction D2. The first sensor IS1, the second sensor IS2, and the third sensor IS3 are be disposed corresponding to each of three parts of the substrate 10 (refers to dotted line in FIG. 2). Accordingly, as the second stage 120 moves in the first direction D1, the first, second, and third sensors IS1 to IS3 pass under the exposure part, and then the substrate 10 passes under the exposure part.

Each of the first sensor IS1, the second sensor IS2, and the third sensor IS3 may measure an intensity of the ultraviolet rays of ultraviolet rays generated by the exposure part 190. The intensity of the ultraviolet rays refers to a total energy amount of the ultraviolet rays radiated on a unit area, during a unit time. In other words, the intensity of the ultraviolet rays refers to the intensity (irradiance) of the ultraviolet rays impacting one of the sensors IS.

In addition, each of the first sensor IS1, the second sensor IS2, and the third sensor IS3 may measure a polarization direction of the ultraviolet rays. Accordingly, uniformity of the polarization direction of the ultraviolet rays over the whole exposure area may be determined.

A moving speed of the second stage 120 (or third stage 130, which is next of the second stage 120) may be determined using the intensity of the ultraviolet rays measured by the first sensor IS1, the second sensor IS2, and the third sensor IS3. For example, the speed of the second stage may be set in order to obtain a certain value which is product of the intensity of the ultraviolet rays and an exposure time per a substrate. The process may be repeated to expose a plurality of substrates.

Equations 1 and 2 below may be referred to.

$$\text{intensity of the ultraviolet rays} * \text{exposure time per one substrate} = \text{constant value} \quad \text{<Equation 1>}$$

$$\text{exposure time per one substrate} = \text{exposure distance per one substrate} / \text{moving speed of stage.} \quad \text{<Equation 2>}$$

Accordingly, when a plurality of substrates is exposed, although there may be a decrease in ultraviolet ray intensity due to senescence of a UV lamp of the exposure part 190, the substrates may be uniformly exposed by controlling the moving speed of the stages. Although not described in the drawings, the substrates may be uniformly exposed by additionally or alternatively controlling a moving speed of the exposure part 190.

In addition, when the exposure part 190 includes a plurality of UV lamps extending in the second direction D2, the amount of UV light radiated from the exposure part 190 may be adjusted using the intensity of the ultraviolet rays measured by the first to third sensors IS1 to IS3. For example, the first to third sensors IS1 to IS3 arranged in the second direction D2 may measure the distribution of the amount of the UV light, so that the distribution of the amount of the UV light may be uniform along the second direction D2, which may be achieved by controlling the amount of the UV light from the UV lamp. Although not described in the drawings, the substrates may be uniformly exposed by additionally or alternatively controlling a moving speed of the exposure part 190.

Accordingly, when the exposure part 190 includes a plurality of UV lamps extending in the second direction D2, the substrate 10 may be uniformly exposed over the whole substrate 10 by individually controlling the UV light intensity of the UV lamps.

FIG. 3 is a plan view illustrating a second stage according to an exemplary embodiment of the inventive concept.

Referring to FIG. 3, the second stage 120 is substantially same as the second stage 120 of FIGS. 1 and 2, except for arrangement and the number of the sensors IS. Thus, any further detailed descriptions concerning the same elements will be briefly described or omitted.

A substrate 10 is laid on a second stage 120. The substrate 10 may be fixed by a substrate fixing part on the second stage 120. The second stage 120 includes a measuring part 122 that extends along a side of the second stage 120 in the second direction D2. Thus, the measuring part 122 is formed corresponding to a width of the substrate 10 in a second direction D2.

A photo-alignment layer is formed on the substrate 10, by coating a photo-alignment material on the substrate 10. After an exposure process, the substrate 10 may be separated into a plurality of substrates. For example, the substrate 10 may be divided into two parts in the second direction D2 (refers to dotted line in FIG. 3). The substrate may be further divided in the direction D1.

The measuring part 122 includes a plurality of sensors. The sensors may measure characteristics of ultraviolet rays generated by the exposure part (refers to 190 of FIG. 1).

The sensors include a first sensor IS1 and a second sensor IS2. The first sensor IS1 and the second sensor IS2 are disposed in the second direction D2. The first sensor IS1 and the second sensor IS2 are disposed corresponding to each of two parts of the substrate 10 (refers to dotted line in FIG. 2). Accordingly, as the second stage 120 moves in the first direction D1, the first and second sensors IS1 and IS2 pass under the exposure part, and then the substrate 10 passes under the exposure part.

Each of the first sensor IS1 and the second sensor IS2 may measure an intensity of the ultraviolet rays of ultraviolet rays generated by the exposure part 190. In addition, each of the first sensor IS1 and the second sensor IS2 may measure a polarization direction of the ultraviolet rays.

Although the exemplary embodiments shown in FIGS. 2 and 3 include two or three sensors arranged in the second direction D2, any number of sensors may be properly arranged according to shapes of substrates.

Figure 4:
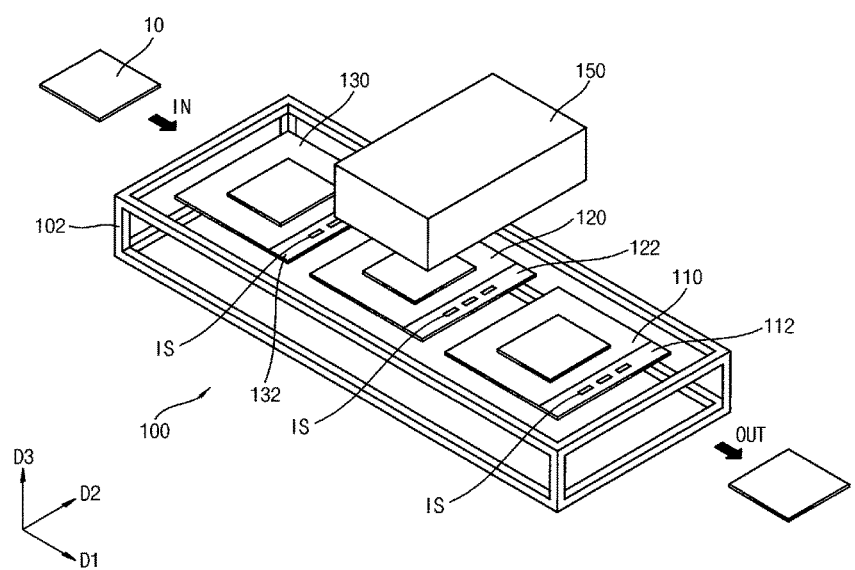
FIG. 4 is a perspective view detail illustrating an exposure apparatus according to an exemplary embodiment of the inventive concept.

FIG. 4 is a perspective view illustrating an exposure apparatus 100 according to an exemplary embodiment of the inventive concept.

Referring to FIG. 4, the exposure apparatus 100 is substantially same as an exposure apparatus of FIG. 1, except that first to third stages includes first to third measuring parts 112, 122 and 132. Thus, any further detailed descriptions concerning the same elements will be briefly described or omitted.

The exposure apparatus 100 includes a frame 102, a first stage 110, a second stage 120, a third stage 130, and an exposure part 190.

The first frame 102 extends in a first direction D1, and has a width in a second direction D2, which is substantially perpendicular to the first direction D1. A plurality of stages is disposed on the frame 102. The frame 102 supports first stage 110, the second stage 120 and the third stage 130. The stages may be continuously transferred on the frame in the first direction D1.

The first stage 110 may transport the substrate 10 in the first direction D1. The first stage 110 includes a first measuring part 112. The first measuring part 112 is disposed at a side of the first stage 110 in the first direction D1 and extends along the side in the second direction D2. For example, the first measuring part 112 is disposed in front of the first stage 110 in the first direction D1 which is a movement direction of the substrate 10, so that the first measuring part 112 may pass under the exposure part 190 before the substrate 10 on the first stage 110 is exposed to ultraviolet rays from exposure part 190.

The first measuring part 112 may include sensors IS. The sensors IS may measure characteristics of ultraviolet rays generated by the exposure part 190. A plurality of the substrates 10 may be uniformly exposed by controlling the intensity and exposure time of the ultraviolet rays generated by the exposure part 190, using the characteristics of ultraviolet rays measured by the sensors IS.

The second stage 120 includes a second measuring part 122. The second measuring part 122 is disposed at a side of the second stage 120 in the first direction D1. For example, the second measuring part 122 is disposed in front of the second stage 120 in the first direction D1, which is a movement direction of the substrate 10, so that the second measuring part 122 may pass under the exposure part 190 before the substrate 10 on the second stage 120 is exposed to ultraviolet rays by the exposure part 190.

The second measuring part 122 extends in the second direction D2. The second measuring part 122 includes a plurality of sensors IS. The sensors IS may measure characteristics of ultraviolet rays generated by the exposure part 190. The substrates 10 may be uniformly exposed by controlling the intensity and exposure time of the ultraviolet rays generated by from the exposure part 190, using the characteristics of ultraviolet rays measured by the sensors IS.

The third stage 130 transports the substrate 10 in the first direction D1. The third stage 130 includes a third measuring part 132. The third measuring part 132 is disposed at a side of the third stage 130 in the first direction D1. For example, the third measuring part 132 is disposed in front of the third stage 130 in the first direction D1, which is a movement direction of the substrate 10, so that the third measuring part 132 may pass under the exposure part 190 before the substrate 10 on the third stage 110 is exposed by the exposure part 190.

The third measuring part 132 extends in the second direction D2. The third measuring part 132 may include a plurality of sensors IS. The sensors IS may measure characteristics of ultraviolet rays generated by the exposure part 190. The substrates 10 may be uniformly exposed by controlling the intensity and exposure time of the ultraviolet rays generated by the exposure part 190 using the characteristics of ultraviolet rays measured by the sensors IS.

Each of the sensors IS may measure an intensity of the ultraviolet rays of ultraviolet rays generated by the exposure part 190. The intensity of the ultraviolet rays refers to a total energy amount of the ultraviolet rays radiated on a unit area during a unit time. In other words, the intensity of the ultraviolet rays refers to the intensity (irradiance) of the ultraviolet rays impacting one of the sensors IS.

In addition, the sensors IS may measure a polarization direction of the ultraviolet rays. Accordingly, uniformity of the polarization direction of the ultraviolet rays over the whole exposure area may be determined.

A moving speed of the first to third stages 110, 120, and 130 may be determined using the intensity of the ultraviolet rays measured by the sensors IS. For example, the speeds of the first to third stages may set to obtain a certain value which is product of the intensity of the ultraviolet rays and an exposure time per a substrate. Equations 3 and 4 below may be referred to. The process may be repeated to expose a plurality of substrates.

intensity of the ultraviolet rays*exposure time per one substrate=constant value    <Equation 3> exposure time per one substrate=exposure distance per one substrate/moving speed of stage.    <Equation 4>

Thus, the sensor IS of the first measuring part 122 of the first stage 110 measures the intensity of the ultraviolet rays, and then the moving speed of the first stage 110 may be controlled based on the intensity of the ultraviolet rays. The sensor IS of the second measuring part 122 of the second stage 120 measures the intensity of the ultraviolet rays, and then the moving speed of the second stage 120 may be controlled based on the intensity of the ultraviolet rays. The sensor IS of the third measuring part 132 of the third stage 130 measures the intensity of the ultraviolet rays, and then moving speed of the third stage 130 may be controlled based on the intensity of the ultraviolet rays.

Accordingly, when a plurality of substrates is exposed, although there may be a decrease in ultraviolet ray intensity due to senescence of a UV lamp of the exposure part 190, the substrates may be uniformly exposed by controlling the speed of exposure. Although not described in the drawings, the substrates may be uniformly exposed by additionally or alternatively controlling a moving speed of the exposure part 190.

The exposure part 190 may be disposed on the frame 102. The exposure part 190 is spaced apart from the frame 102 in a third direction D3 which is substantially perpendicular to the first and second directions D1 and D2.

The exposure part 190 includes a UV light source that generates ultraviolet rays, and a wire grid polarizer for polarizing the ultraviolet rays.

According to the present exemplary embodiment, each of the first to third stages includes the first to third stages measuring the intensity of the ultraviolet rays, so that proper moving speed of the stages may be applied in real-time.

Figure 5:
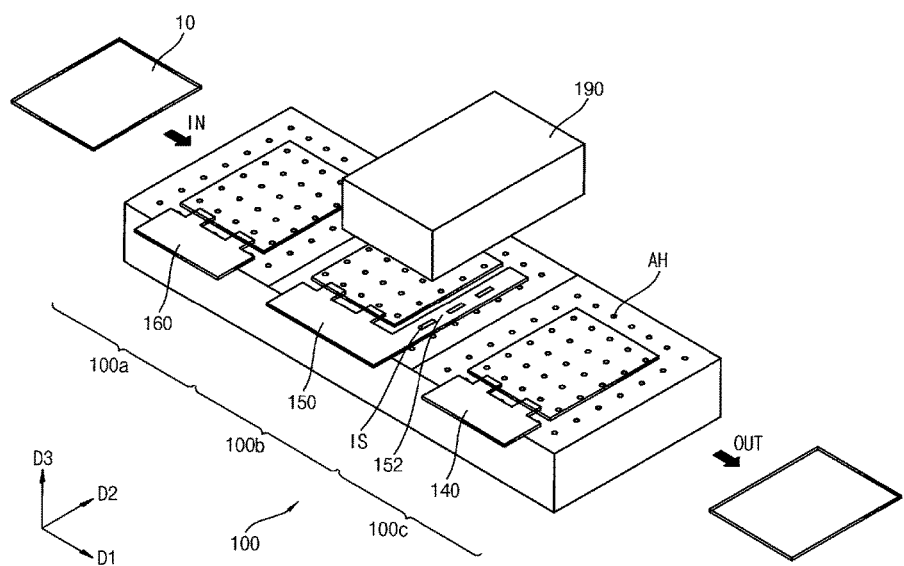
FIG. 5 is a perspective view detail illustrating an exposure apparatus according to an exemplary embodiment of the inventive concept.

FIG. 5 is a perspective view illustrating an exposure apparatus 100 according to an exemplary embodiment of the inventive concept.

Referring to FIG. 5, the exposure apparatus 100 includes a loading portion 100a, a working portion 100b, an unloading portion 100c and an exposure part 190.

The loading portion 100a, the working portion 100b, and the unloading portion 100c are disposed in a first direction D1 in order. A transporting part configured to continuously transport a plurality of substrates 10 may be disposed on the loading portion 100a, the working portion 100b, and the unloading portion 100c.

For example, the transporting part includes a first transporting part 140, a second transporting part 150, and the third transporting part 160. The first transporting part 140, the second transporting part 150, and the third transporting part 160 are disposed on the loading portion 100a, the working portion 100b, and the unloading portion 100c, respectively. As shown in the figure, a substrate 10 is loaded on the loading portion 100a, and then the substrate 10 may be transported in the first direction D1 by the third transporting part 160. Accordingly, the substrate 10 is disposed on the working portion 100b and passes under the exposure part 190 to a position of the second transporting part 150 in FIG. 5, so the substrate 10 may be exposed by the exposure part 190. At this time, the second transporting part 150 moves in the first direction D1 to a position of the first transporting part 140 in FIG. 5, and the first transporting part 140 may move in a direction opposite to the first direction D1 to a position of the third transporting part 160 in FIG. 5. For example, the first transporting part 140 may move in a direction opposite to the first direction D1, sidestepping the exposure area under the exposure part 190, to be placed at a loading position to load a substrate. Accordingly, the first to third transporting parts 140, 150, and 160 may continuously transport a plurality of substrates 10 in the first direction D1.

The substrate 10 is loaded on the loading portion 100a. Then, the substrate 10 is transported to the working portion 100b by the first, second or third transporting part 140, 150, or 160, respectively, in the first direction D1. When the substrate 10 is passed to the working portion 100b, the substrate 10 is exposed to ultraviolet rays by the exposure part 190.

Figure 6:
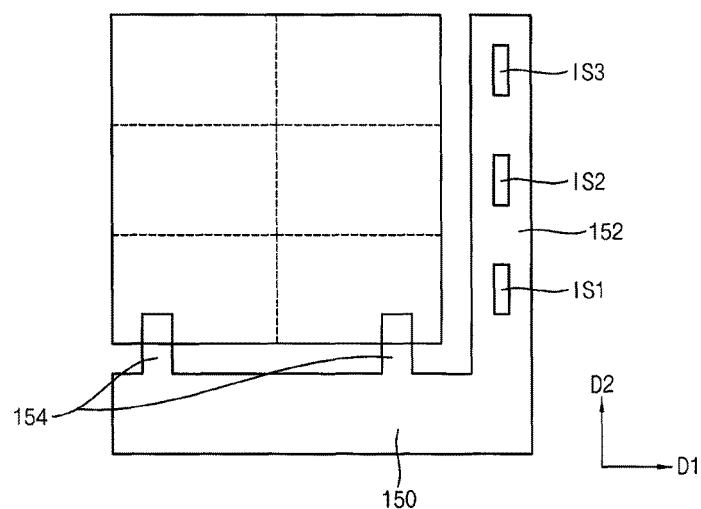
FIG. 6 is a plan view detail illustrating a second transporting part of FIG. 5.

Each of the first to third transporting parts 140, 150, and 160 includes a gripper which holds the substrate (refers to 154 of FIG. 6). The gripper may fix the substrate 10. For example, the gripper may fix the substrate 10 by grabbing, or by vacuum absorption.

The substrate 10 is loaded on the loading portion 100a (refers to an arrow IN in FIG. 5). The first transporting part 140 then transports the substrate 10 in the first direction D1. The substrate 10 passes under the exposure part 190 by the first transporting part 140. Following that, the substrate 10 is transported to the unloading portion 100c and unloaded from the unloading portion 100c (refers to an arrow OUT in FIG. 5). The first transporting part 140 may fix the substrate 10 by vacuum absorption.

The substrate 10 is loaded on the loading portion 100a (refers to an arrow IN in the FIG. 5). The substrate 10 then passes under the exposure part 190 by the second transporting part 150. Following that, the substrate 10 is transported to the unloading portion 100c, and unloaded from the unloading portion 100c (refers to an arrow OUT in FIG. 5). The second transporting part 150 may fix the substrate 10 by vacuum absorption.

The second transporting part 150 includes a measuring part 152. The measuring part 152 extends in a second direction D2 which is substantially perpendicular to the first direction D1. The measuring part 152 may include a plurality of sensors IS. The sensors IS may measure characteristics of ultraviolet rays generated by the exposure part 190. The substrates 10 may be uniformly exposed by controlling the intensity and exposure time of the ultraviolet rays generated by the exposure part 190, using the characteristics of ultraviolet rays measured by the sensors IS.

The substrate 10 is loaded on the loading portion 100a (refers to an arrow IN in the FIG. 5). Then, the substrate 10 passes under the exposure part 190 by the third transporting part 160. Following this, the substrate 10 is transported to the unloading portion 100c and unloaded from the unloading portion 100c (refers to an arrow OUT in FIG. 5). The third transporting part 160 may fix the substrate 10 by a vacuum absorption.

A plurality of air holes AH is formed on surfaces of the loading portion 100a, the working portion 100b, and the unloading portion 100c. Air may be pushed through the air holes AH to form a positive pressure on the surfaces. Accordingly, the substrate 10 may be transported with air cushioning.

The exposure part 190 is disposed on the working portion 100b. Thus, the exposure part 190 is spaced apart the working portion 100b in a third direction D3, which is substantially perpendicular to the first and second directions D1 and D2.

The exposure part 190 includes a UV light source that generates ultraviolet rays, and a wire grid polarizer for polarizing the ultraviolet rays. The exposure part 190 radiates the ultraviolet rays onto the substrates 10 on the working portion 100b. Accordingly, the ultraviolet rays from the exposure part 190 may harden a photo-alignment material coated on the substrate 10 to form a photo-alignment layer on the substrate 10.

The UV light source may be a UV lamp extending in the second direction D2. In addition, the UV light source may be a plurality of UV lamps arranged in the second direction D2, and each of the UV lamps may extend in the second direction D2. The UV lamps may be controlled to generate ultraviolet rays having different intensities.

The exposure part 190 may be tilted with respect to a plane in parallel with the first and second directions D1 and D2, with respect to the working portion 100b. Accordingly, an alignment direction of the photo-alignment layer may be inclined by a predetermined angle with respect to a boundary of the substrate 10 and the plane, in parallel with the first and second directions D1 and D2.

FIG. 6 is a plan view illustrating a second transporting part of FIG. 5.

Referring to FIG. 6, a second transporting part 150 includes a measuring part 152 and a gripper 154. The gripper 154 holds the substrate 10 in order to transport the substrate 10 by movement of the second transporting part 150. The gripper 154 may be a pair of tongs that grab the substrate 10. In addition, the gripper 154 may have a plurality of vacuum holes (not shown) to generate a negative pressure for vacuum absorption.

A photo-alignment layer is formed on the substrate 10 by coating a photo-alignment material on the substrate 10. The substrate 10 may be a substrate for manufacturing a plurality of display panels for liquid crystal display apparatuses. The display panel may include a liquid crystal layer including liquid crystal molecules. The display panel may include an alignment layer that gives a pre-tilt angle to the liquid crystal molecules. The alignment layer may be the photo-alignment layer hardened by radiation from the ultraviolet rays.

After an exposure process, the substrate 10 may be separated into a plurality of substrates. For example, the substrate 10 may be divided into three parts in the second direction D2 (refers to dotted line in FIG. 6). The substrate may be further divided in the direction D1.

The measuring part 122 extends in the second direction D2. Thus, the measuring part 122 is formed corresponding to a width of the substrate 10 in a second direction D2.

The measuring part 122 includes a plurality of sensors IS. The sensors may measure characteristics of ultraviolet rays generated by an exposure part (refers to 190 of FIG. 5).

The sensors IS include a first sensor IS1, a second sensor IS2, and a third sensor IS3. The first sensor IS1, the second sensor IS2, and the third sensor IS3 are disposed in the second direction D2. The first sensor IS1, the second sensor IS2 and the third sensor IS3 are disposed corresponding to each of three parts of the substrate 10 (refers to dotted line in the FIG. 5). Accordingly, as the second transporting part 150 moves in the first direction D1, the first, second, and third sensors IS1 to IS3 pass under the exposure part. Then, the substrate 10 passes under the exposure part 190.

Each of the first sensor IS1, the second sensor IS2, and the third sensor IS3 may measure an intensity of the ultraviolet rays of ultraviolet rays generated by the exposure part 190. The intensity of the ultraviolet rays refers to a total energy amount of the ultraviolet rays radiated on a unit area, during a unit time. In other words, the intensity of the ultraviolet rays refers to the intensity (irradiance) of the ultraviolet rays impacting one of the sensors IS.

In addition, each of the first sensor IS1, the second sensor IS2, and the third sensor IS3 may measure a polarization direction of the ultraviolet rays. Accordingly, uniformity of the polarization direction of the ultraviolet rays over the whole exposure area may be determined.

In addition, when the exposure part 190 includes a plurality of UV lamps extending in the second direction D2, the amount of UV light radiated from the exposure part 190 may be adjusted using the intensity of the ultraviolet rays measured by the first to third sensors IS1 to IS3. For example, the first to third sensors IS1 to IS3 arranged in the second direction D2 may measure the distribution of the amount of the UV light, so that the distribution of UV light may be uniform along the second direction D2, which may be achieved by controlling the amount of the UV light from the UV lamp.

Accordingly, when the exposure part 190 includes a plurality of UV lamps extending in the second direction D2, the substrate 10 may be uniformly exposed over the entire surface of the substrate 10 by individually controlling the UV light intensity of the UV lamps.

Figure 7:
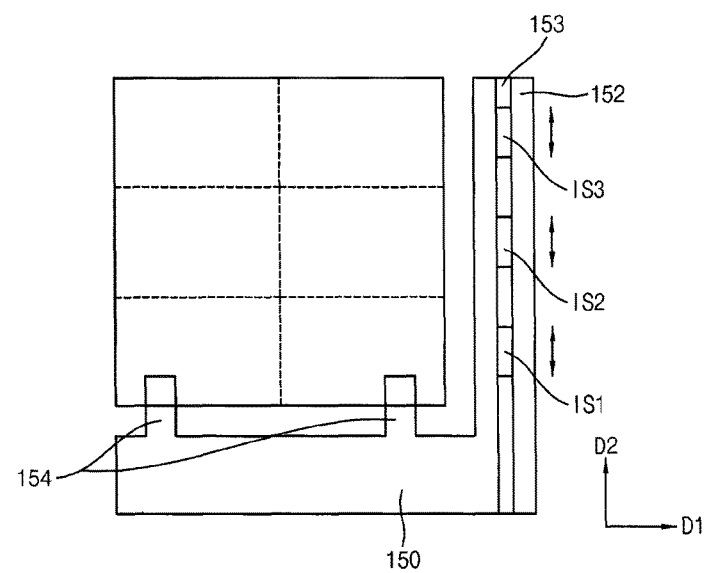
FIG. 7 is a plan view detail illustrating a second transporting part according to an exemplary embodiment of the inventive concept.

FIG. 7 is a plan view illustrating a second transporting part according to an exemplary embodiment of the inventive concept.

Referring to FIG. 7, a second transporting part 150 includes a measuring part 152 and a gripper 154. The gripper 154 fixes the substrate 10 in order to transport the substrate 10 by moving the second transporting part 150.

A photo-alignment layer is formed on the substrate 10 by coating a photo-alignment material on the substrate 10. The substrate 10 may be a substrate for manufacturing a plurality of display panels for liquid crystal display apparatuses. After an exposure process, the substrate 10 may be separated into a plurality of substrates.

The measuring part 152 extends in the second direction D2. Thus, the measuring part 122 is formed corresponding to a width of the substrate 10 in a second direction D2.

The measuring part 152 includes a plurality of sensors IS and a rail 153 that is capable of moving the sensors in a second direction D2. The sensors may measure characteristics of ultraviolet rays generated by the exposure part 190. The rail 153 extends in the second direction D2.

The sensors IS include a first sensor IS1, a second sensor IS2, and a third sensor IS3. The first sensor IS1, the second sensor IS2, and the third sensor IS3 may move on the rail 153 along the second direction D2. Thus, characteristics of ultraviolet rays may be measured by the sensors IS corresponding to a plurality of parts divided in the substrate 10 along the second direction D2.

Each of the first sensor IS1, the second sensor IS2, and the third sensor IS3 may measure an intensity of the ultraviolet rays of ultraviolet rays generated by the exposure part 190. The intensity of the ultraviolet rays refers to a total energy amount of the ultraviolet rays radiated on a unit area, during a unit time. In other words, the intensity of the ultraviolet rays refers to the intensity (irradiance) of the ultraviolet rays impacting one of the sensors IS.

In addition, each of the first sensor IS1, the second sensor IS2, and the third sensor IS3 may measure a polarization direction of the ultraviolet rays. Accordingly, uniformity of the polarization direction of the ultraviolet rays over the whole exposure area may be determined.

In addition, when the exposure part 190 includes a plurality of UV lamps extending in the second direction D2, the amount of UV light from the exposure part 190 may be adjusted using the intensity of the ultraviolet rays measured by the first to third sensors IS1 to IS3. For example, the first to third sensors IS1 to IS3 arranged in the second direction D2 may measure the distribution of the amount of the UV light, so that the distribution of the amount of the UV light may be uniform along the second direction D2, which may be achieved by controlling the amount of the UV light from the UV lamp.

Accordingly, when the exposure part 190 includes a plurality of UV lamps extending in the second direction D2, the substrate 10 may be uniformly exposed to the UV rays over a whole surface of the substrate 10 by individually controlling the UV light intensity of the UV lamps.

Figure 8:
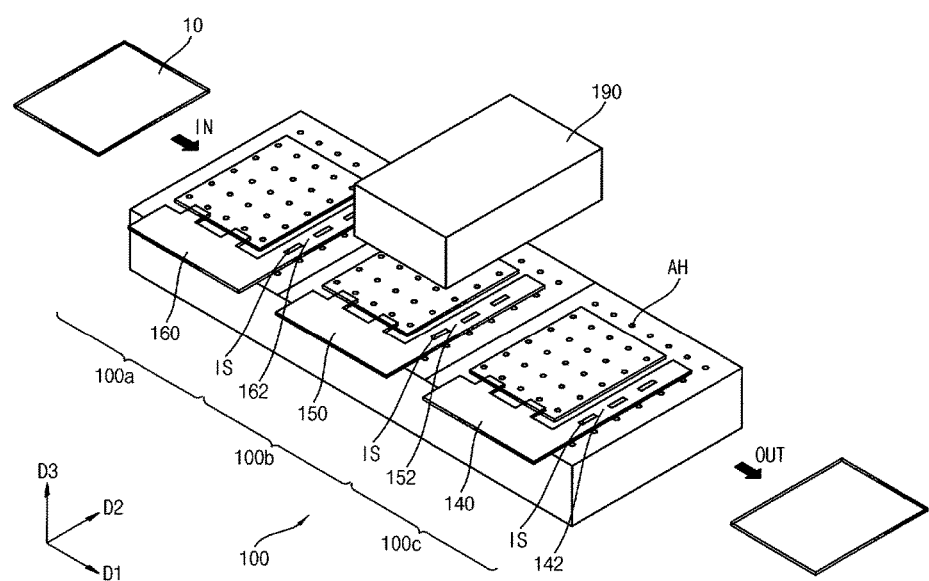
FIG. 8 is a perspective view briefly illustrating an exposure apparatus according to an exemplary embodiment of the inventive concept.

FIG. 8 is a perspective view illustrating an exposure apparatus according to an exemplary embodiment of the inventive concept.

Referring to FIG. 8, an exposure apparatus 100 includes a loading portion 100a, a working portion 100b, an unloading portion 100c, and an exposure part 190.

The loading portion 100a, the working portion 100b, and the unloading portion 100c are disposed in a first direction D1 in order. A transporting part configured to continuously transport a plurality of substrates 10 may be disposed on the loading portion 100a, the working portion 100b, and the unloading portion 100c. For example, the transporting part may include a first transporting part 140, a second transporting part 150, and a third transporting part 160.

Each of the first to third transporting parts 140, 150, and 160 includes a gripper (refers to 154 of FIG. 6) which holds the substrate. The gripper may fix the substrate 10. For example, the gripper may fix the substrate 10 by grabbing, or by vacuum absorption.

The substrate 10 is loaded on the loading portion 100a (refers to an arrow IN in the FIG. 8). The first transporting part 140 then transports the substrate 10 in the first direction D1. The substrate 10 passes under the exposure part 190 by the first transporting part 140. Following that, the substrate 10 is transported to the unloading portion 100c, and unloaded from the unloading portion 100c (refers to an arrow OUT in FIG. 8). The first transporting part 140 may fix the substrate 10 by vacuum absorption.

The first transporting part 140 includes a first measuring part 142. The first measuring part 142 extends in a second direction D2, which is substantially perpendicular to the first direction D1. The first measuring part 142 may include a plurality of sensors IS. The sensors IS may measure characteristics of ultraviolet rays generated by the exposure part 190. The substrates 10 may be uniformly exposed by controlling the intensity and exposure time of the ultraviolet rays generated by the exposure part 190, using the characteristics of ultraviolet rays measured by the sensors IS.

The substrate 10 is loaded on the loading portion 100a (refers to an arrow IN in FIG. 8). The substrate 10 passes under the exposure part 190 by the second transporting part 150. Following that, the substrate 10 is transported to the unloading portion 100c, and unloaded from the unloading portion 100c (refers to an arrow OUT in FIG. 8). The second transporting part 150 may fix the substrate 10 by vacuum absorption.

The second transporting part 150 includes a second measuring part 152. The second measuring part 152 extends in a second direction D2, which is substantially perpendicular to the first direction D1. The second measuring part 152 may include a plurality of sensors IS. The sensors IS may measure characteristics of ultraviolet rays generated from the exposure part 190. The substrates 10 may be uniformly exposed by controlling the intensity and exposure time of the ultraviolet rays generated by the exposure part 190 using the characteristics of ultraviolet rays measured by the sensors IS.

The substrate 10 is loaded on the loading portion 100a (refers to an arrow IN in FIG. 8). The substrate 10 then passes under the exposure part 190 by the third transporting part 160. Following that, the substrate 10 is transported to the unloading portion 100c, and unloaded from the unloading portion 100c (refers to an arrow OUT in FIG. 8). The third transporting part 160 may fix the substrate 10 by vacuum absorption.

The third transporting part 160 includes a third measuring part 162. The third measuring part 162 extends in a second direction D2 which is substantially perpendicular to the first direction D1. The third measuring part 162 may include a plurality of sensors IS. The sensors IS may measure characteristics of ultraviolet rays generated by the exposure part 190. The substrates 10 may be uniformly exposed by controlling the intensity and exposure time of the ultraviolet rays generated by the exposure part 190, using the characteristics of ultraviolet rays measured by the sensors IS.

Figure 9:
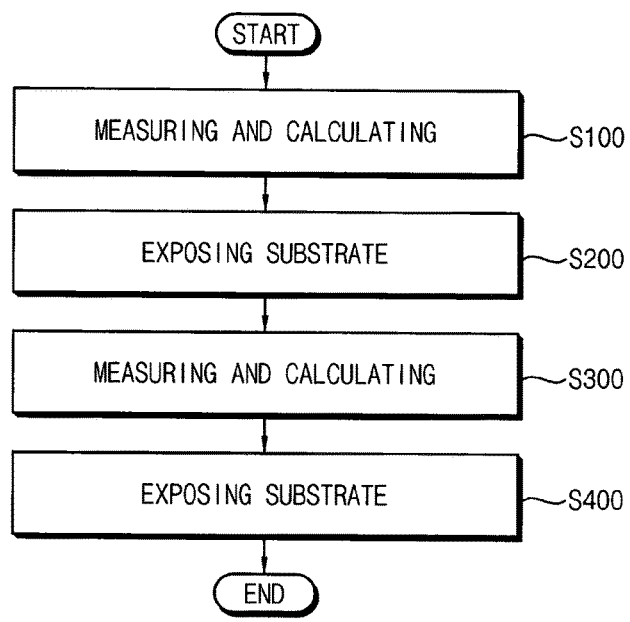
FIG. 9 is a flow chart illustrating an exposure method according to an exemplary embodiment of the inventive concept.
Figure 10A:
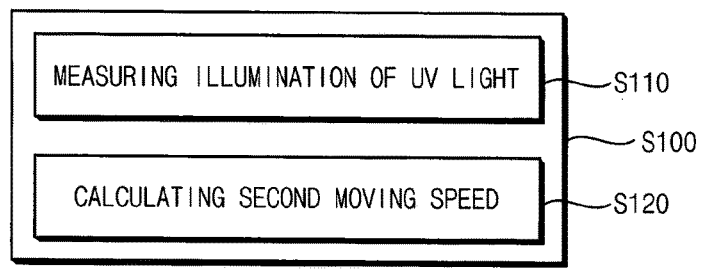
FIGS. 10A to 10D are flow chart detail illustrating each of steps of the exposure method.
Figure 10B:
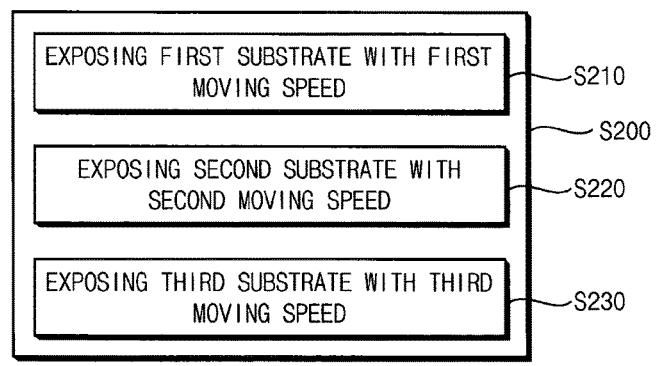
Figure 10C:
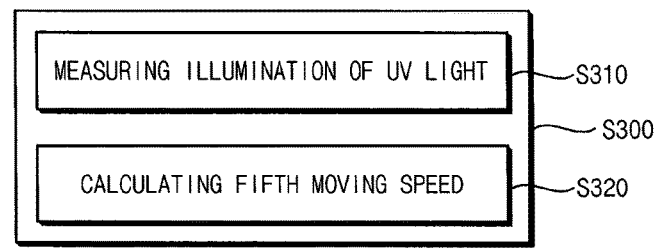
Figure 10D:
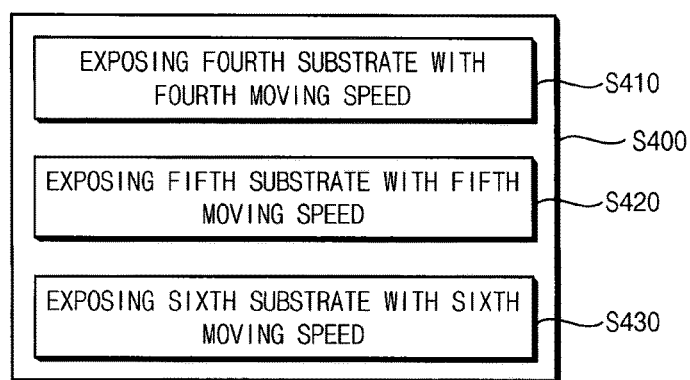
Figure 11A:
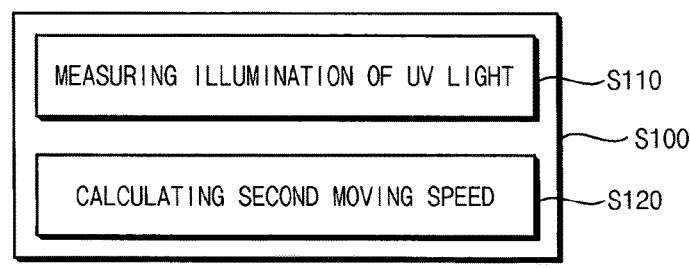
FIGS. 11A to 11D are flow chart detail illustrating each of steps of an exposure method according to an exemplary embodiment of the inventive concept.
Figure 11B:
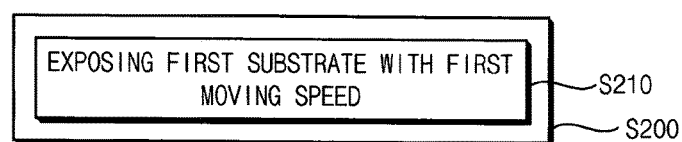
Figure 11C:
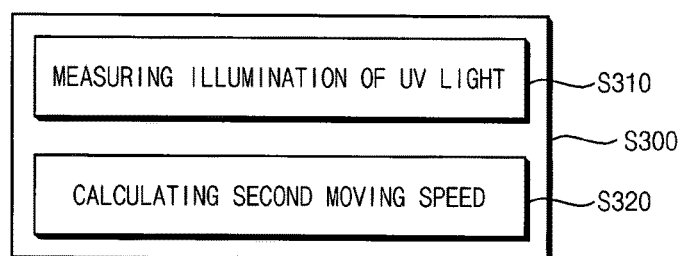
Figure 11D:
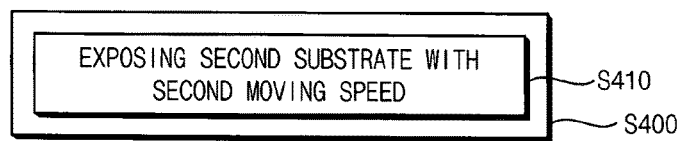

FIG. 9 is a flow chart illustrating an exposure method according to an exemplary embodiment of the inventive concept.

Referring to FIG. 9, an exposure method includes measuring and calculating (S100), exposing a substrate (S200), measuring and calculating (S300), and exposing a substrate (S400).

In the first measuring and calculating (S100), characteristics of ultraviolet rays generated from an exposure part (refers to 190 of FIG. 1) may be measured using a sensor (refers to IS of FIG. 1). Proper speed and amount of exposure may be calculated using the measured characteristics. Thus, the speed and amount of exposure may be controlled using the measured characteristics of the ultraviolet rays.

In the exposing a substrate (S200), a substrate (refers to 10 of FIG. 1) is transported and exposed to the ultraviolet rays from the exposure part 190. At this time, the intensity and exposure time of the ultraviolet rays to be exposed on the substrate may be calculated in the first measuring and calculating (S100).

In the second measuring and calculating (S300), characteristics of ultraviolet rays generated from the exposure part 190 may be measured using the sensor IS. The characteristics of ultraviolet rays may change constantly, so that the measured characteristics in the second measuring and calculation (S300) may be different from those that in the first measuring and calculating (S100). New proper intensity and exposure time may be calculated using the measured characteristics from the second measuring and calculation (S300). Thus, the intensity and exposure time may be controlled using the measured characteristics of the ultraviolet rays.

In the exposing a substrate (S400), a transported substrate is exposed to the ultraviolet rays from the exposure part 190. At this time, the substrate may be exposed with the intensity and exposure time that is calculated in the second measuring and calculating (S300).

Accordingly, when a plurality of substrates is exposed, although there may be a decrease in ultraviolet ray intensity due to senescence of a UV lamp of the exposure part, the substrates may be uniformly exposed by controlling the speed of exposure.

FIGS. 10A to 10D are flow charts illustrating each step of the exposure method shown in FIG. 9.

Referring to FIGS. 9 and 10A to 10D, an exposure method may be performed by using an exposure apparatus of FIG. 1 (or 5).

First measuring and calculating (S100) includes measuring the illumination of ultraviolet rays (S110) and calculating a second moving speed (S120).

In the measuring the illumination of ultraviolet rays (S110), intensity of the ultraviolet rays of ultraviolet rays generated from an exposure part (refers to 190 of FIG. 1) may be measured using a sensor (refers to IS of FIG. 1). In the calculating a second moving speed (S120), a second moving speed which is exposure speed of a second substrate is calculated. For example, equations 1 and 2 below may be used.

$$\text{intensity of the ultraviolet rays} * \text{exposure time per one substrate} = \text{constant value} \quad \text{<Equation 1>}$$

$$\text{exposure time per one substrate} = \text{exposure distance of second substrate/moving speed of second substrate} \quad \text{<Equation 2>}$$

Accordingly, the second moving speed (moving speed of the second substrate) may be calculated.

Exposing a substrate (S200) includes exposing a first substrate with a first moving speed (S210), exposing a second substrate with a second moving speed (S220), and exposing a third substrate with a third moving speed (S230).

In the exposing a first substrate with a first moving speed (S210), a first substrate is moved and exposed with a first moving speed.

In the exposing a second substrate with a second moving speed (S220), a second substrate is moved and exposed with the second moving speed, which is calculated in the calculating a second moving speed (S120).

In the exposing a third substrate with a third moving speed (S230), a third substrate is moved and exposed with a third moving speed. The third moving speed may be substantially same as the second moving speed.

Second measuring and calculating (S300) includes measuring illumination of ultraviolet rays (S310) and calculating a fifth moving speed (S320). In the measuring illumination of ultraviolet rays (S310), an intensity of the ultraviolet rays of ultraviolet rays generated from the exposure part 190 may be measured using the sensor. In the calculating a fifth moving speed (S320), a fifth moving speed, which is the exposure speed of a fifth substrate, is calculated. For example, equations 1 and 2 below may be referred to.

$$\text{intensity of the ultraviolet rays} * \text{exposure time per one substrate} = \text{constant value} \quad \text{<Equation 1>}$$

$$\text{exposure time per one substrate} = \text{exposure distance of fifth substrate/moving speed of fifth substrate} \quad \text{<Equation 2>}$$

Accordingly, the fifth moving speed (moving speed of the fifth substrate) may be calculated.

Exposing a substrate (S400) includes exposing a fourth substrate with a fourth moving speed (S410), exposing a fifth substrate with a fifth moving speed (S420), and exposing a sixth substrate with a sixth moving speed (S430).

In the exposing a fourth substrate with a fourth moving speed (S410), a fourth substrate is moved and exposed with a fourth moving. The fourth moving speed may be substantially same as the second moving speed.

In the exposing a fifth substrate with a fifth moving speed (S420), a fifth substrate is moved and exposed with the fifth moving speed, which is calculated in the calculating a fifth moving speed (S320).

In the exposing a sixth substrate with a sixth moving speed (S430), a sixth substrate is moved and exposed with a sixth moving speed. The sixth moving speed may be substantially same as the fifth moving speed.

The above process may be repeated to expose a plurality of substrates. Accordingly, when a plurality of substrates is exposed, although there may be a decrease in ultraviolet ray intensity due to senescence of the UV lamp of the exposure part, the substrates may be uniformly exposed by controlling the moving speed of the substrates.

FIGS. 11A to 11D are flow chart detail illustrating each of steps of an exposure method according to an exemplary embodiment of the inventive concept.

Referring to FIGS. 9 and 11A to 11D, an exposure method may be performed by using an exposure apparatus of FIG. 4 (or 8).

First measuring and calculating (S100) includes measuring illumination of ultraviolet rays (S110) and calculating a first moving speed (S120).

In the measuring illumination of ultraviolet rays (S110), intensity of the ultraviolet rays of ultraviolet rays generated from an exposure part 190 may be measured using a sensor IS. In the calculating a first moving speed (S120), a first moving speed which is an exposure speed of a first substrate is calculated. For example, equations 1 and 2 below may be referred to.

$$\text{intensity of the ultraviolet rays} * \text{exposure time per one substrate} = \text{constant value} \quad \text{<Equation 1>}$$

$$\text{exposure time per one substrate} = \text{exposure distance of first substrate/moving speed of first substrate} \quad \text{<Equation 2>}$$

Accordingly, the first moving speed (moving speed of the first substrate) may be calculated.

Exposing a substrate (S200) includes exposing a first substrate with a first moving speed (S210). In the exposing a first substrate with a first moving speed (S210), a first substrate is moved and exposed with a first moving speed, which is calculated in the calculating a first moving speed (S120).

Second measuring and calculating (S300) includes measuring illumination of ultraviolet rays (S310) and calculating a second moving speed (S320). In the measuring illumination of ultraviolet rays (S310), intensity of the ultraviolet rays of ultraviolet rays generated from the exposure part 190 may be measured using the sensor IS. In the calculating a second moving speed (S320), a second moving speed, which is exposure speed of a second substrate, is calculated. For example, equations 1 and 2 below may be referred to.

$$\text{intensity of the ultraviolet rays} * \text{exposure time per one substrate} = \text{constant value} \quad \text{<Equation 1>}$$

$$\text{exposure time per one substrate} = \text{exposure distance of second substrate/moving speed of second substrate} \quad \text{<Equation 2>}$$

Accordingly, the second moving speed (moving speed of the second substrate) may be calculated.

Exposing a substrate (S400) includes exposing a second substrate with a second moving speed (S410). In the exposing a second substrate with a second moving speed (S420), a second substrate is moved and exposed with the second moving speed, which is calculated in the calculating a second moving speed (S320).

The above process may be repeated to expose a plurality of substrates. Accordingly, when a plurality of substrates is exposed, although there may be a decrease in ultraviolet ray intensity due to senescence of a UV lamp of the exposure part, the substrates may be uniformly exposed by controlling the moving speed of the substrates.

Figure 12:
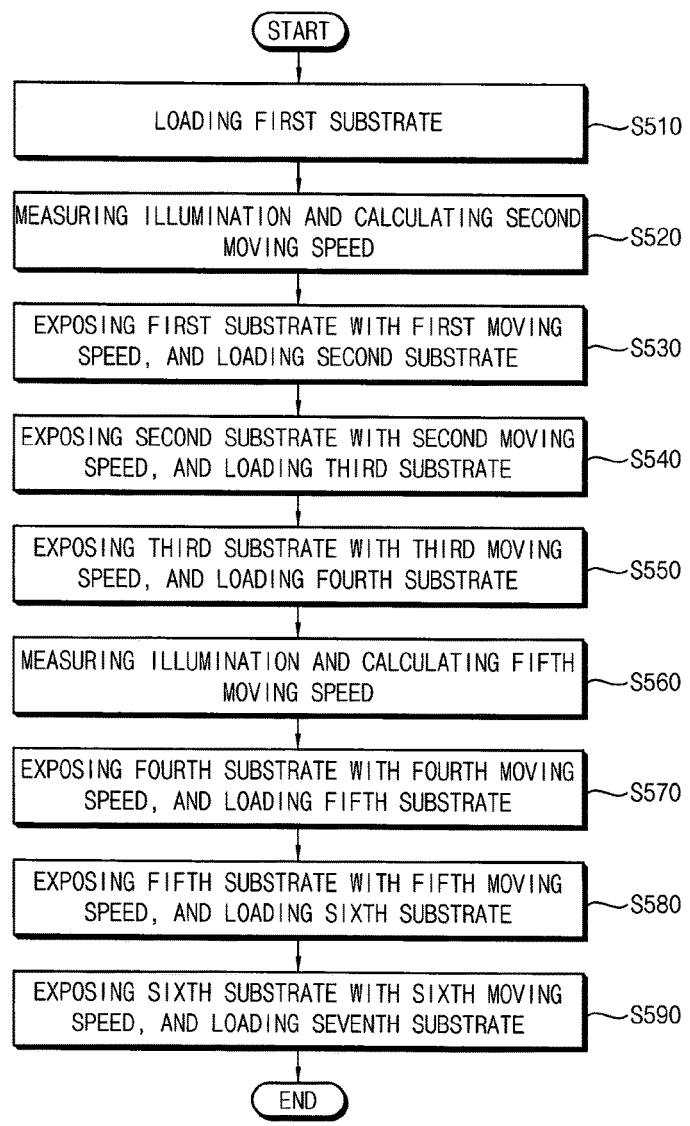
FIG. 12 is a flow chart illustrating an exposure method according to an exemplary embodiment of the inventive concept.

FIG. 12 is a flow chart illustrating an exposure method according to an exemplary embodiment of the inventive concept.

Referring to FIG. 12, an exposing method includes loading a first substrate (S510), measuring illumination and calculating a second moving speed (S520), exposing the first substrate with a first moving speed and loading a second substrate (S530), exposing the second substrate with the second moving speed and loading a third substrate (S540), exposing the third substrate with a third moving speed and loading a fourth substrate (S550), measuring illumination and calculating a fifth moving speed (S560), exposing the fourth substrate with a fourth moving speed and loading a fifth substrate (S570), exposing the fifth substrate with the fifth moving speed and loading a sixth substrate (S580), and exposing the sixth substrate with a sixth moving speed and loading a seventh substrate (S590).

A first substrate is loaded in the loading a first substrate (S510).

In the measuring illumination and calculating a second moving speed (S520), an intensity of the ultraviolet rays of ultraviolet rays generated by an exposing part 190 may be measured using a sensor IS to measure the intensity of the ultraviolet rays. A second moving speed may be calculated based on the intensity of the ultraviolet rays.

In the exposing the first substrate with a first moving speed and loading a second substrate (S530), the first substrate is transported with a first moving speed to be exposed, and a second substrate is loaded at the same time.

In the exposing the second substrate with the second moving speed and loading a third substrate (S540), the second substrate is transported with the second moving speed, and a third substrate is loaded at the same time.

In the exposing the third substrate with a third moving speed and loading a fourth substrate (S550) the third substrate is transported with a third moving speed, and a fourth substrate is loaded at the same time. The third moving speed may be substantially same as the second moving speed.

In the measuring illumination and calculating a fifth moving speed (S560), an intensity of the ultraviolet rays of ultraviolet rays generated from an exposing part 190 may be measured again using the sensor IS. A fifth moving speed may be calculated based on the intensity of the ultraviolet rays.

In the exposing the fourth substrate with a fourth moving speed and loading a fifth substrate (S570), the fourth substrate is transported with a fourth moving speed, and a fifth substrate is loaded at the same time. The fourth moving speed may be substantially same as the third moving speed.

In the exposing the fifth substrate with the fifth moving speed and loading a sixth substrate (S580), the fifth substrate is transported with the fifth moving speed, and a sixth substrate is loaded at the same time.

In the exposing the sixth substrate with a sixth moving speed and loading a seventh substrate (S590), the sixth substrate is transported with a sixth moving speed, and a seventh substrate is loaded at the same time. The sixth moving speed may be substantially same as the fifth moving speed.

The above process may be repeated to expose a plurality of substrates. Accordingly, when a plurality of substrates is exposed, although an amount of ultraviolet rays may decrease due to senescence of the UV lamp of the exposure part 190, the substrates may be uniformly exposed by controlling the moving speed of the substrates.

FIG. 13 is a flow chart illustrating an exposure method according to an exemplary embodiment of the inventive concept.

Referring to FIG. 13, an exposure method includes loading a first substrate (S610), measuring illumination and calculating a first moving speed (S620), exposing the first substrate with the first moving speed and loading a second substrate (S630), measuring illumination and calculating a second moving speed (S640), exposing the second substrate with the second moving speed and loading a third substrate (S650), measuring illumination and calculating a third moving speed (S660), and exposing the third substrate with the third moving speed and loading a fourth substrate (S670).

A first substrate is loaded in the loading a first substrate (S610).

In the measuring illumination and calculating a first moving speed (S620), an intensity of the ultraviolet rays of ultraviolet rays generated by an exposing part 190 may be measured using a sensor IS to measure the intensity of the ultraviolet rays. A first moving speed may be calculated based on the intensity of the ultraviolet rays.

In the exposing the first substrate with the first moving speed and loading a second substrate (S630), the first substrate is transported with the first moving speed to be exposed, and a second substrate is loaded at the same time.

In the measuring illumination and calculating a second moving speed (S640), an intensity of the ultraviolet rays of ultraviolet rays generated by an exposing part 190 may be measured again. A second moving speed may be calculated based on the intensity of the ultraviolet rays.

In the exposing the second substrate with the second moving speed and loading a third substrate (S650), the second substrate is transported with the second moving speed to be exposed, and a third substrate is loaded at the same time.

In the measuring illumination and calculating a third moving speed (S660), an intensity of the ultraviolet rays of ultraviolet rays generated from an exposing part 190 may be measured again. A third moving speed may be calculated based on the intensity of the ultraviolet rays.

In the exposing the third substrate with the third moving speed and loading a fourth substrate (S670), the third substrate is transported with the third moving speed to be exposed, and a fourth substrate is loaded at the same time.

The above process may be repeated to expose a plurality of substrates. Accordingly, when a plurality of substrates is exposed, although ultraviolet rays may decrease due to senescence of the UV lamp of the exposure part 190, the substrates may be uniformly exposed by controlling the moving speed of the substrates.

According to the present inventive concept, an exposure apparatus includes a sensor to measure an intensity of the ultraviolet rays and a stage to transport a plurality of substrates, so that uniform exposure to a plurality of substrates may be obtained by continuously adjusting moving speed of the substrate in accordance with change of the intensity of the ultraviolet rays In addition, first to third stages includes first to third measuring parts, respectively, so that proper moving speed of the stages may be applied in real-time in accordance with change of the intensity of the ultraviolet rays.

The exposure method repeats the step of measuring intensity of the ultraviolet rays and calculating exposure speed. When a plurality of substrates is exposed, although there may be a decrease in ultraviolet ray intensity due to senescence of the UV lamp of an exposure part, the substrates may be uniformly exposed by continuously adjusting the speed of exposure.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. An exposure apparatus, comprising:
a substrate transporting assembly configured to transport a substrate in a first direction, the substrate transporting assembly comprising a support configured to support the substrate during transport, the support comprising a first measuring part extending therefrom; and
an exposure part disposed over the substrate transporting assembly, the exposure part being configured to irradiate the substrate with ultraviolet rays to photo-align components of a photo-alignment layer disposed on a plane of the substrate,
wherein the first measuring part is configured to measure a polarization direction of the ultraviolet rays before the substrate is irradiated,
wherein the exposure part is configured to tilt with respect to the plane based on the polarization direction of the ultraviolet rays to photo-align the components in a direction intersecting the plane, and
wherein the first measuring part extends along a majority of an edge of the support in a second direction substantially perpendicular to the first direction.

2. The exposure apparatus of claim 1, wherein:
the support is a first stage configured to support the substrate thereon; and
the substrate transporting assembly further comprises a second stage configured to support another substrate thereon, the second stage being configured to transport the another substrate in the first direction.

3. The exposure apparatus of claim 2, wherein:
the first stage is disposed between the second stage and the first measuring part; and
the first measuring part is disposed at a side of the first stage in the first direction.

4. The exposure apparatus of claim 3, wherein the first measuring part comprises sensors spaced apart from one another in the second direction.

5. The exposure apparatus of claim 4, wherein the sensors are configured to measure the polarization direction of the ultraviolet rays.

6. The exposure apparatus of claim 1, wherein:
the support comprises a first gripper configured to secure the substrate; and
the substrate transporting assembly further comprises a second gripper configured to secure another substrate and to transport the another substrate in the first direction.

7. The exposure apparatus of claim 6, wherein:
the second gripper comprises a second measuring part extending in the second direction; and
the second measuring part comprises a sensor configured to measure an intensity of ultraviolet rays.

8. The exposure apparatus of claim 6, wherein the first and second grippers are configured to secure the substrate and the another substrate via vacuum absorption.

9. An exposure apparatus, comprising:
a substrate transporting assembly to transport a substrate in a first direction, the substrate transporting assembly comprising:
a first support to support the substrate during transport; and
a second support coupled to the first support;
a source of ultraviolet illumination to irradiate the substrate with ultraviolet rays, the source overlapping the substrate transporting assembly,
wherein the second support comprises:
a rail extending in a second direction crossing the first direction; and
at least one sensor slideably coupled to the rail, the at least one sensor being configured to slide on the rail relative to the substrate to detect one or more aspects of the ultraviolet rays with respect to different portions of the substrate during transport of the substrate in the first direction.

10. The exposure apparatus of claim 9, wherein:
the source comprises an arrangement of sources of ultraviolet illumination; and
the source is configured to individually adjust the sources of ultraviolet illumination based on the one or more aspects of the ultraviolet rays.

11. An exposure method to at least partially form aspects of consumer products, the exposure method comprising:
exposing, via an exposure apparatus, a first substrate to ultraviolet rays by moving the first substrate past a source of ultraviolet rays at a first transport speed, the first substrate being associated with a first consumer product of the consumer products;
measuring, while a second substrate moves towards the source and the first substrate moves away from the source, a first intensity of the ultraviolet rays, the second substrate being associated with a second consumer product of the consumer products, wherein the second consumer product is different from the first consumer product;
determining a second transport speed based on the first intensity and a set total amount of exposure; and
exposing, via the exposure apparatus, the second substrate different from the first substrate to the ultraviolet rays by moving the second substrate past the source at the second transport speed.

12. The exposure method of claim 11, wherein:
measuring the first intensity comprises measuring intensity of the ultraviolet rays generated from the source;
the first intensity of the ultraviolet rays is a total energy amount of the ultraviolet rays radiated on a unit area during a unit time;
a product of the first intensity of the ultraviolet rays and an exposure time per one substrate is equivalent to the set total amount of exposure; and
the exposure time per one substrate is equivalent to an exposure distance of the second substrate divided by the second transport speed.

13. The exposure method of claim 12, further comprising:
exposing, via the exposure apparatus, a third substrate by moving the third substrate past the source at a third transport speed.

14. The exposure method of claim 13, wherein the third transport speed is substantially equivalent to the second transport speed.

15. The exposure method of claim 14, further comprising:
exposing, via the exposure apparatus, a fourth substrate by moving the fourth substrate at a fourth transport speed past the source; and
exposing, via the exposure apparatus, a fifth substrate by moving the fifth substrate at a fifth transport speed past the source.

16. The exposure method of claim 15, further comprising:
measuring a second intensity of the ultraviolet rays; and
determining the fifth transport speed based on the second intensity and the set total amount of exposure,
wherein:
- a product of the second intensity of the ultraviolet rays and an exposure time per one substrate is equivalent to the set total amount of exposure; and
- the exposure time per one substrate is equivalent to an exposure distance of the fifth substrate divided by the fifth transport speed.

17. The exposure method of claim 15, wherein the fourth transport speed is substantially equivalent to the second transport speed.

18. The exposure method of claim 11, wherein:
the first and second substrates are two substrates of a larger plurality of substrates moved past the source; and
a transport speed of each substrate of the plurality of substrates is set such that each substrate of the plurality of substrates receives a total amount of exposure that is substantially equivalent to the set total amount of exposure.

19. The exposure method of claim 11, wherein the second substrate is loaded into the exposure apparatus while the first substrate is being exposed.

20. The exposure method of claim 19, wherein:
the exposure method exposes a plurality of substrates comprising the first and second substrates, and determines an exposure speed for each substrate of the plurality of substrates; and
each substrate of the plurality of substrates is transported at its correspondingly determined exposure speed.

* * * * *